United States Patent
Arnold et al.

(10) Patent No.: US 7,781,332 B2
(45) Date of Patent: Aug. 24, 2010

(54) METHODS TO MITIGATE PLASMA DAMAGE IN ORGANOSILICATE DIELECTRICS USING A PROTECTIVE SIDEWALL SPACER

(75) Inventors: John C. Arnold, North Chatham, NY (US); Sampath Purushothaman, Yorktown Heights, NY (US); Muthumanickam Sankarapandian, Niskayuna, NY (US); Hosadurga K. Shobha, Niskayuna, NY (US); Terry A. Spooner, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 11/857,805

(22) Filed: Sep. 19, 2007

(65) Prior Publication Data
US 2009/0072401 A1 Mar. 19, 2009

(51) Int. Cl.
*H01L 21/4763* (2006.01)
*H01L 21/302* (2006.01)
(52) U.S. Cl. ........................ 438/639; 438/623; 438/710; 438/723; 257/758; 257/E21.235
(58) Field of Classification Search .................. 438/639, 438/623, 710, 723; 257/E21.235
See application file for complete search history.

(56) References Cited

U.S. PATENT DOCUMENTS

| | | | | |
|---|---|---|---|---|
| 6,156,651 A | * | 12/2000 | Havemann | 438/674 |
| 6,171,951 B1 | * | 1/2001 | Lee et al. | 438/640 |
| 6,475,929 B1 | * | 11/2002 | Gabriel et al. | 438/783 |
| 6,599,840 B2 | * | 7/2003 | Wu et al. | 438/705 |
| 7,071,126 B2 | | 7/2006 | Johnston et al. | |
| 7,179,758 B2 | | 2/2007 | Chakrapani et al. | |
| 7,416,956 B2 | * | 8/2008 | Yuan | 438/427 |
| 2002/0182872 A1 | * | 12/2002 | Wu et al. | 438/705 |

OTHER PUBLICATIONS

Cote, W., et al., "Non-Poisoning Dual Damascene Patterning Scheme for Low-k and Ultralow-k BEOL", Proceedings of 2006 Advanced Metallization Conference, pp. 43-44, Oct. 2006.

* cited by examiner

*Primary Examiner*—Nitin Parekh
(74) *Attorney, Agent, or Firm*—Scully, Scott, Murphy & Presser, P.C.; Daniel P. Morris, Esq.

(57) ABSTRACT

Plasma damage in ultra low k dielectric materials during formation of a dual damascene metal interconnect structure is reduced by providing a protective spacer on sidewalls of a line trench. A densified trench bottom region may be additionally formed directly beneath an exposed horizontal surface of the line trench. The protective spacer and/or the densified trench bottom region protects an ultra low k intermetal dielectric layer from plasma damage during a plasma strip process that is used to remove a disposable via fill plug employed in the dual damascene metal interconnect structure.

14 Claims, 7 Drawing Sheets

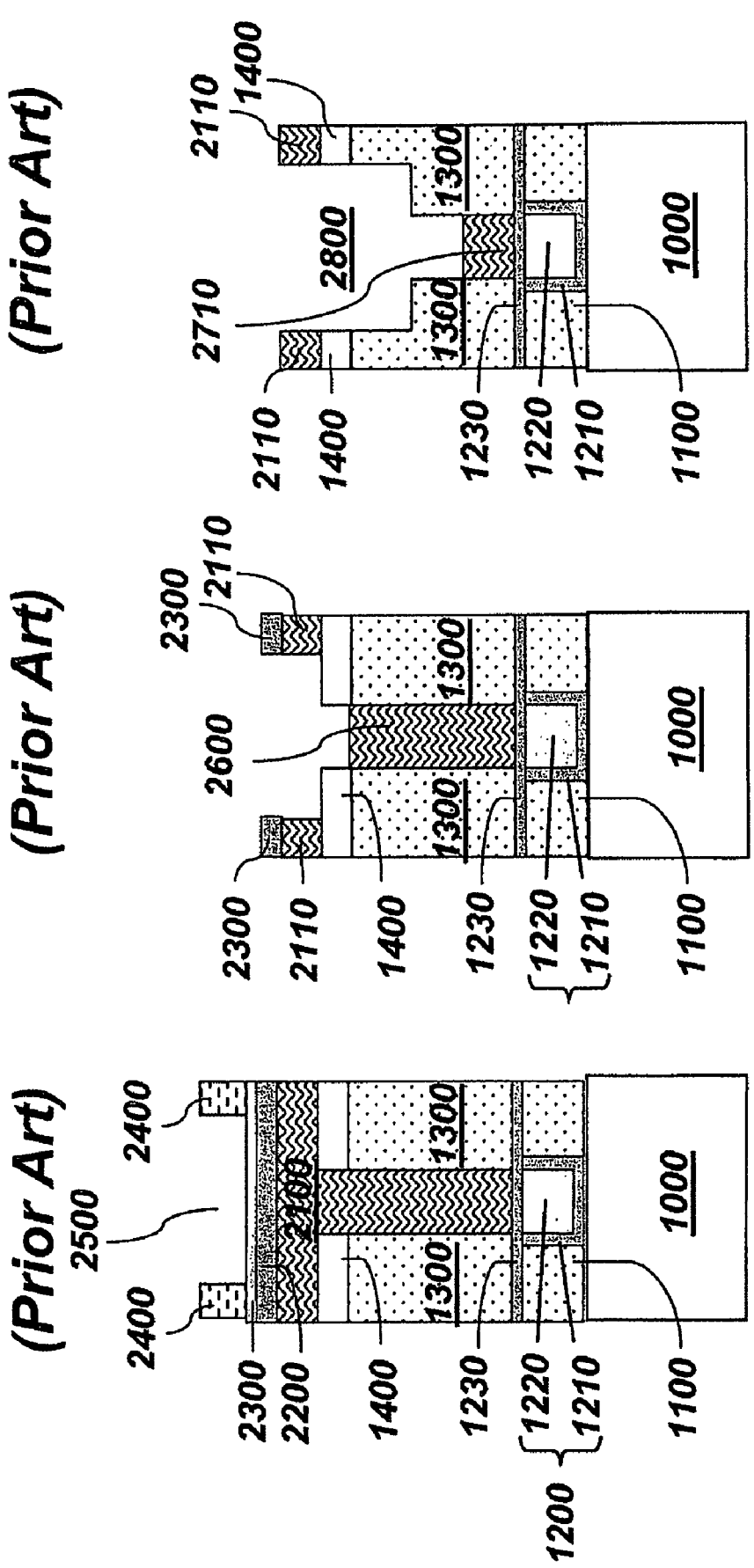

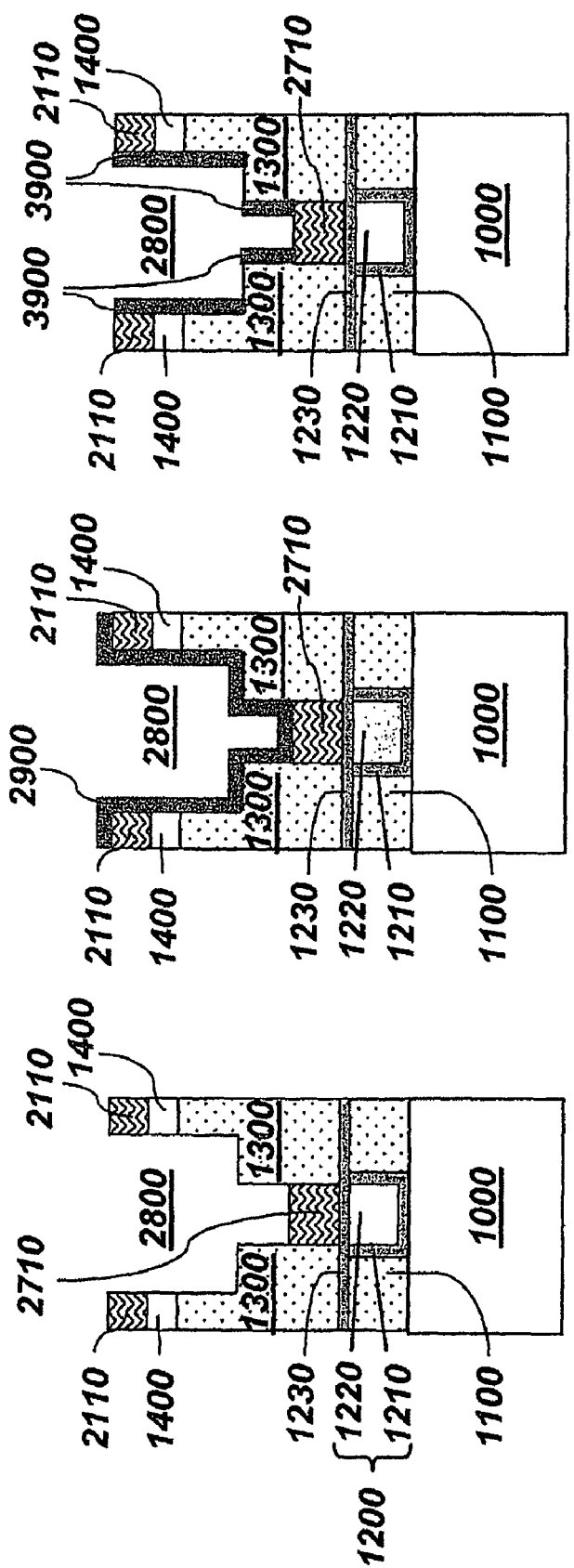

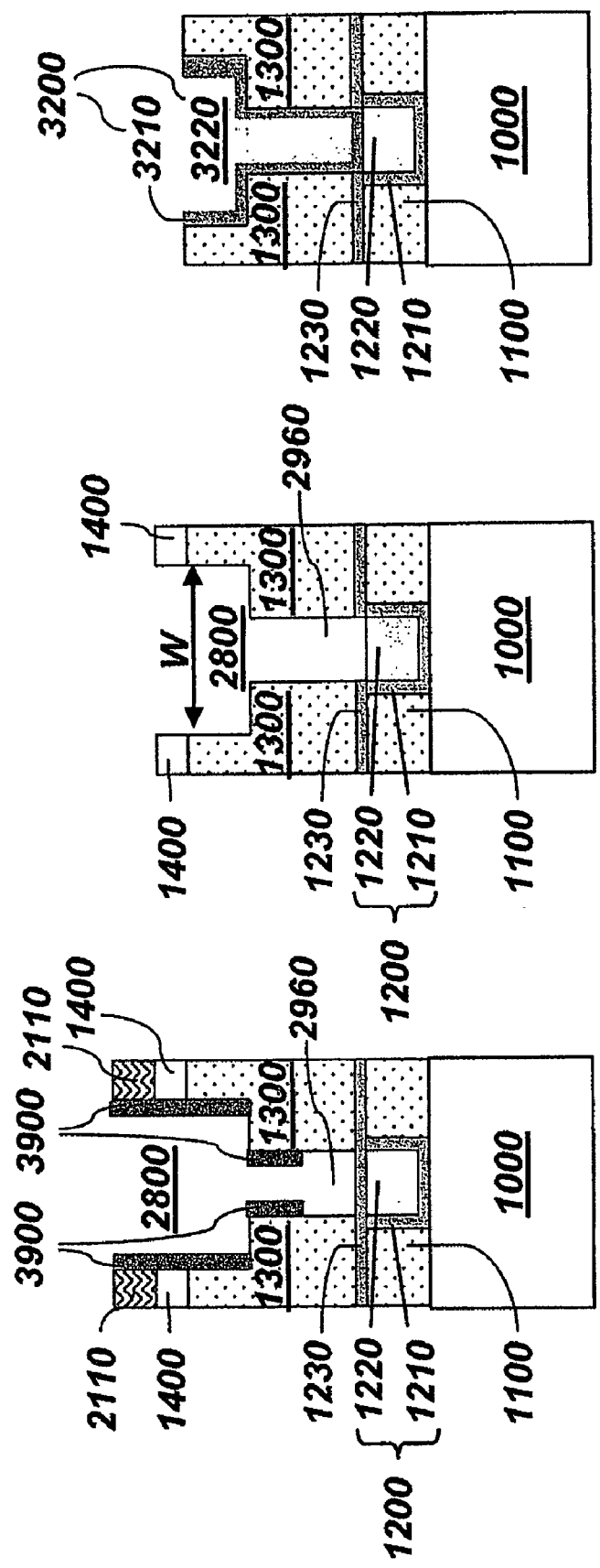

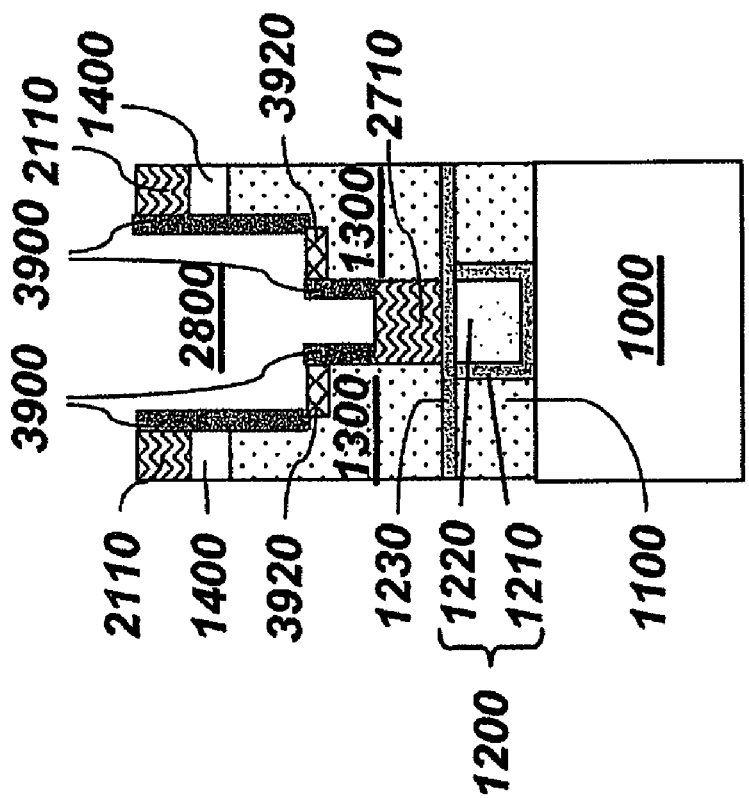
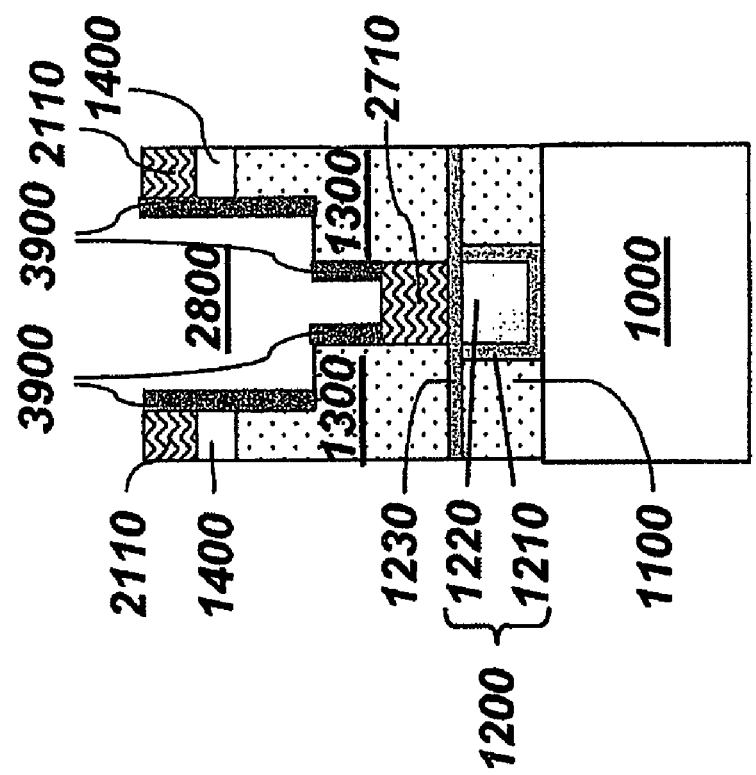

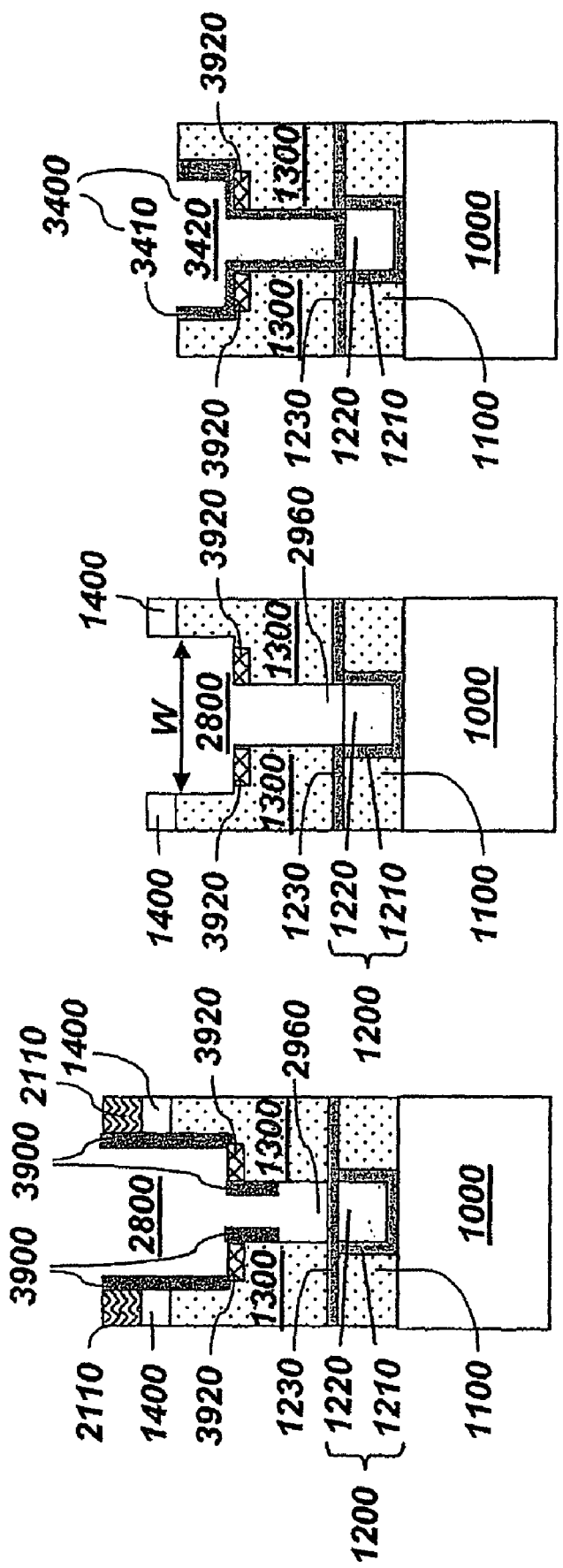

METHODS TO MITIGATE PLASMA DAMAGE IN ORGANOSILICATE DIELECTRICS USING A PROTECTIVE SIDEWALL SPACER

RELATED APPLICATIONS

The present application is related to a co-pending U.S. patent application Ser. No. 11/857,760, which is incorporated herein by reference.

FIELD OF THE INVENTION

The present invention generally relates to methods of manufacturing a semiconductor structure, and particularly, to methods of manufacturing an interconnect structure having reduced signal propagation delay in a semiconductor circuit by minimizing plasma damage to low k and ultra low k organosilicate intermetal dielectric layers with a protective sidewall spacer.

BACKGROUND OF THE INVENTION

Advanced semiconductor chips, such as high performance microprocessor, microcontroller and communication chips, require high speed interconnect structures between individual semiconductor devices which are used to perform various functions such as logical operations, storing and retrieving data, providing control signals and the like. With the progress in the semiconductor device technology leading to ultra large scale integration, the overall speed of operation of the advanced semiconductor chips is approaching a limit due to signal propagation delay in interconnection wires, which are employed as the high speed interconnect structures, between the individual semiconductor devices on the same advanced semiconductor chip.

The signal propagation delay in an interconnect structure is dependent on an RC product of the interconnect structure, where R denotes the resistance of the interconnect wires and C which the interconnect wires are embedded. Use of copper instead of aluminum as the interconnect wiring material has allowed reduction of the resistance contribution to the RC product. Current focus in microelectronics industry is on reducing the interconnect capacitance by employing low dielectric constant (low k) dielectric materials in the interconnect structure of the advanced semiconductor chips, which typically contain a multilayered interconnect structure.

One prior art method of forming an interconnect structure with small feature sizes is the dual damascene (DD) process described, for example, in W. Cote et al, "Non-Poisoning Dual Damascene Patterning Scheme for Low-k and Ultra Low-k BEOL," Proceedings of 2006 Advanced Metallization Conference, pp. 43-44, October (2006). In general, a back end of the line (BEOL) interconnect structure comprises two types of features: metal lines that extend along in a horizontal direction across a semiconductor chip, and metal vias which extend vertically to connect metal lines at different levels of the BEOL interconnect structure. In the DD process, metal lines at a same level and metal vias located directly below the level of the metal lines are formed at the same processing step by filling line trenches formed at the same level and via holes formed directly below the level of the line trenches with metal, followed by planarization of the metal.

The level of the metal vias is referred to as a via level, which also comprises a via level dielectric material as well as the metal vias. The level of the metal lines is referred to as a line level, which also comprises a line level dielectric material as well as the metal lines. Historically, both the via level dielectric material and the line level dielectric material comprise an inorganic glass such as undoped silicate glass (USG) or a fluorosilicate glass (FSG), which is typically deposited by plasma enhanced chemical vapor deposition (PECVD). Recently, low dielectric constant (low k) organosilicate films comprising silicon, carbon, oxygen and hydrogen have been introduced as the via level dielectric material and the line level dielectric material to enable reduction in interconnect capacitance, and consequently, reduction in signal propagation delays in the advanced semiconductor chips.

A dual damascene process sequence is commonly employed to fabricate a back end of the line copper interconnect structures for the advanced semiconductor chips. One of the commonly used back end of the line integration scheme that employs the dual damascene process sequence is known as a "via first" integration scheme, in which via holes are formed first followed by formation of line trenches. Subsequently, metal vias are formed in the via holes and metal liners are formed in the line trenches during the same processing step that typically employs metal plating and chemical mechanical polishing (CMP).

An exemplary prior art via first integration scheme is schematically illustrated in FIGS. 1A-1I. Referring to FIG. 1A, a substrate 1000 containing at least one semiconductor device (not shown) is provided. The substrate 1000 may, or may not, comprise at least one interconnect wiring (not shown). A first intermetal dielectric (IMD) layer 1100 is formed on the substrate 1000 with a first level damascene metal line 1200 embedded therein. The first level damascene metal line 1200 typically comprises a first conductive diffusion barrier/adhesion layer 1210, which is often referred to as a barrier metal liner. The first level damascene metal line 1200 further comprises a first level metal line 1220, which typically comprises copper. A diffusion barrier dielectric layer 1230, which typically comprises silicon nitride, silicon carbide or silicon carbonitride, is deposited atop the embedded first level damascene metal line 1200 and the first IMD layer 1100.

A second intermetal dielectric (IMD) layer 1300 is then applied on top of the diffusion barrier dielectric layer 1230. The total thickness of the second IMD layer 1300 and the diffusion barrier dielectric layer 1230 is nominally equal to the sum of a target of a dual damascene line and a target height of a dual damascene via. As mentioned above, the first IMD layer 1100 and/or the second IMD layer 1300 typically comprise a low k (k<3.0) organosilicate dielectric material or an ultra low k (k<2.5) organosilicate dielectric material in the advanced semiconductor chips. The porosity level of the low k or ultra low k organosilicate dielectric materials increases as the dielectric constant k decreases.

A hard mask layer 1400 is deposited on top of the second IMD layer 1300 to protect the top surfaces of the IMD layer 1300 during subsequent lithography and etch processes. Typically the hard mask layer 1400 is an oxide layer formed by plasma enhanced chemical vapor deposition (PECVD) employing precursors such as silane, oxygen, or TEOS. Alternately, the hard mask layer 1400 may comprise silicon, carbon, oxygen, hydrogen (referred to as SiCOH), and optionally nitrogen, and is deposited employing precursors containing oxygen, silane, methylated silane, octamethyltetrasiloxane, and the like.

A first antireflective coating (ARC) layer 1450 is then applied to mitigate reflections from the first and second IMD layers (1100, 1300) during lithography. The first ARC layer 1450 typically comprises an optically absorptive organic material having a specific refractive index and a thickness tuned for this function. A first photoresist 1500 is applied and patterned by photolithography to form a via hole pattern 1510 within the layer of the first photoresist 1500 on top of the first ARC layer 1450.

Referring to FIG. 1B, the via hole pattern 1510 is sequentially transferred into the first ARC layer 1450, the hard mask layer 1400 and the second IMD layer 1300 using a reactive ion etch (RIE) process to produce a via hole 1600. A top surface of the diffusion barrier dielectric layer 1230 is exposed after the reactive ion etch.

Referring to FIG. 1C, remaining portions of the first photoresist 1500 and the first ARC layer 1450 are then stripped, for example, by a plasma ashing process. The strip process can be performed in the same process chamber as, or in a different process chamber from, the process chamber used for the RIE process of FIG. 1B. Typically, stripping damage is sustained by the second IMD layer 1300 during the strip process.

Referring to FIG. 1D, a disposable via fill material is applied over the hard mask layer 1400 to form a disposable via fill layer 2100, which fills the via hole 1600 and provides a substantially planar overfill over the hard mask layer 1400. The disposable via fill material may comprise an organic material that is capable of a gap fill of the via hole 1600. Preferably, the disposable via fill layer 2100 is self-planarizing. Non-limiting examples of the disposable via fill material include NFC1400™ produced by JSR Corporations, Japan, and Accuflow™ produced by Honeywell Microelectronic Materials™, Sunnyvale, Calif.

Typically, the disposable via fill material is an organic material having a low molecular weight, i.e., having a molecular weight less than 100,000, and more preferably, having a molecular weight less than 30,000. The disposable via fill material has a gap fill property that enables filling the via hole 1600 with the disposable via fill material. The disposable via fill material also meets etch rate contrast requirements relative to the organosilicate dielectric material of the second ILD layer 1300.

A low temperature oxide (LTO) layer 2200 is deposited by a suitable deposition method such as plasma enhanced chemical vapor deposition (PECVD), chemical vapor deposition (CVD), or spin coating. Typically, a deposition temperature below 250° C. is desirable for the deposition of the LTO layer 2200. The disposable via fill material 2100 is thermomechanically stable during the deposition of the LTO layer 2200, and has a sufficient etch rate differential during a subsequent reactive ion etch (RIE) relative to the second IMD 1300 layer, which typically comprises an organosilicate glass. As will be seen subsequently, the disposable via fill layer 2100 provides the function of an RIE etch mask in the patterning of line trenches in the second IMD layer 1300.

A second antireflective coating (ARC) layer 2300 and a second photoresist 2400 are thereafter applied on top of the LTO layer 2200. The second photoresist 2400 is then patterned to form a line trench pattern 2500 within the layer of the second photoresist 2400 on top of the second ARC layer 2300.

Referring to FIG. 1E, the line trench pattern 2500 in the second photoresist 2400 is transferred by a RIE process into the second ARC layer 2300, the LTO layer 2200, and the disposable via fill layer 2100. During the RIE process, the second photoresist 2400 and the second ARC layer 2300 are typically consumed as they are etched concurrently with the etching of the exposed portions of the disposable via fill layer 2100. At the moment top surfaces of the hard mask layer 1400 are exposed, the remaining portions of the LTO layer 2200 constitutes a patterned LTO layer 2210, and remaining portions of the disposable via fill layer 2100 comprises a patterned disposable material layer 2110 and a via plug 2600.

Referring to FIG. 1F, as the RIE process continues, the patterned LTO layer 2210 is typically completely consumed during the etching of the hard mask layer 1400 and the early stage of etching of the second IMD layer 1300. The remaining portion of the via plug 2600 constitutes a disposable via fill plug 2710. The pattern transfer through the RIE process continues further into the second IMD layer 1300 employing the patterned disposable material layer 2110 as an etch mask to form a line trench 2800. The etch depth of line trench 2800 in the second IMD layer 1300 is determined based on the target height of a metal line in a completed dual damascene structure.

Referring to FIG. 1G, the patterned disposable material layer 2110 and disposable via fill plug 2710, both of which comprise the material of the disposable via fill material of the disposable via fill layer 2100 in FIG. 1D, are subsequently stripped using a plasma strip process. This plasma strip process induces most of the plasma damage in the second IMD layer 1300 since all the side walls of the line trench and the via opening are exposed to a strip plasma that needs to be aggressive enough to remove all of the patterned disposable material layer 2110 and the disposable via fill plug 2710. Any residual material from the disposable via fill plug 2710 left over in the via hole prevents or degrades a metal to metal contact between a fill metal to be formed at the via opening and the first level metal line 1220 when the dual damascene structure is metallized. Absence or degradation of the metal to metal contact results in low electrical yield.

Thus an optimally aggressive strip is normally employed in the plasma strip process. As a result, portions of the second IMD layer 1300 underneath the exposed sidewalls and horizontal surfaces of the second IMD layer 1300 are plasma damaged and chemically modified (loss of carbon content) to a certain depth to form a plasma damaged IMD region 3050. A first width W' of the line trench denotes the horizontal distance between the exposed sidewall surfaces of the plasma damaged IMD region 3050 in the line trench.

Referring to FIG. 1H, the diffusion barrier dielectric layer 1230 is etched by a RIE to open a contact hole to the first level damascene metal line 1200 underneath. A via cavity 3150 is formed between the line trench 2800 and the first level damascene metal line 1200. This processing step is often performed in a process chamber in the same tool cluster as the tool cluster containing the RIE chamber used for patterning of the metal line as shown in FIG. 1F. Further, the RIE chamber and the strip chambers are often part of a single tool cluster with a provision for transferring a substrate from one to the other without exposure to ambient air.

After completion of the plasma strip processing, a wet clean may optionally be employed to remove any residual material left in the via hole. The residual material may contain silicon since the residual material may be generated from reaction products of the second IMD layer 1300 and/or the hard mask layer 1400 with plasma gas species, or the residual material may comprise a resputtered silicon containing material from the second IMD layer 1300 and/or the hard mask layer 1400. A wet clean including a dilute hydrofluoric acid (DHF) treatment is often employed to effect the cleaning of the residual material. While being effective for silicon containing residual materials, the wet clean also tends to dissolve all or at least a large portion of the plasma damaged IMD region 3050. This results in an increase in the width of the line trench. A second width W" of the line trench denotes the horizontal distance between the exposed sidewall surfaces of the second IMD region 1300 in the line trench.

The second width W" is greater than the first width W' since the line trench 2800 widens during the wet clean. Depending on the extent of the plasma damaged IMD region 3050, the incremental change from the first width W' to the second width W" may be a significant fraction of the first width W'. To compensate for this incremental change, the corresponding line width in the line trench pattern 2500 in the second photoresist 2400 in FIG. 1D needs to be printed smaller than the second width by an amount equivalent to the sum of the etch bias during the transfer of the line trench pattern 2500 into the second IMD layer 1300 and the incremental change from the first width W' to the second width W". This lithographic constraint becomes a particularly challenging problem in the construction of high performance, high density metal interconnects in which fine line widths are required and porous ultra low dielectric constant IMD materials are employed since increased porosity renders the ultra low dielectric constant IMD materials prone to significant plasma damage, and consequently, a significant incremental change from the first width W' to the second width W".

Referring to FIG. 1I, the via cavity 3150 and the line trench 2800, which collectively constitute a dual damascene cavity (2800, 3150), are thereafter metallized, i.e., filled with metal by a plating process, followed by planarization, for example, by chemical mechanical polishing (CMP) to form a dual damascene metal interconnect structure 3200 which comprises a second conductive diffusion barrier/adhesion layer 3210 and second level integrated metal line and via 3220 which typically comprise copper. The processing steps of 1A-1I may be repeated to construct a multi-level dual damascene metal interconnect structure (not shown).

Alternate integration schemes may also be used for constructing a dual damascene metal interconnect structure in which a line trench is formed prior to formation of a via hole. While the sequence of process flow of the alternate integration schemes is different from the process flow of the via first integration scheme described above, the salient concerns regarding the exposure of the low k or ultra low k IMD material to plasma damage and widening of the line trench during a wet clean are also applicable to such alternate integration schemes.

In order to lower the interconnect capacitance, it is necessary to use lower k dielectrics such as PECVD or spin-on organosilicates which have k values in the range from about 2.7 to about 3.0 instead of a PECVD silicon dioxide based dielectrics having k values from about 3.6 to about 4.1. Structurally, the organosilicates have a silica-like backbone with alkyl or aryl groups attached directly to the Si atoms in the network. Their elemental compositions generally comprise Si, C, O, and H in various ratios. The C and H are most often present in the form of methyl groups ($-CH_3$). The primary function of the methyl groups is to create a free volume in, and reduce the polarizability of, layers of the organosilicates that are formed in a metal interconnect structure. A secondary function of the methyl groups is to add hydrophobicity to the organosilicates. The k value can be further reduced to 2.2 (ultra low k) and even below 2.0 (extreme low k) by introduction of porosity in the layers of the organosilicates. For the purpose of brevity, the ultra low k and extreme low k materials are herein collectively referred to as very low k materials.

Although a tunable range of k values is possible with this set of very low k materials, there are several difficulties in integrating these materials with copper interconnects in a dual damascene process sequence described above or by any other variation of the dual damascene process sequence. The main difficulty is that the organosilicates are very sensitive to a plasma exposure because of the relative ease of oxidation or cleavage of the Si-organic group linkage (for example, Si-methyl) which results in formation of silanol (Si—OH) groups in the film through a reaction with moisture in the ambient atmosphere. Silanols further absorb moisture and hence increase the dielectric constant and the dielectric loss factor of the film significantly, thus negating the performance benefits expected from the very low k material. Silanols also increase the electrical leakage in the very low k material, and thus create a potentially unreliable interconnect structure. Since reactive ion etch and plasma etch are key steps required in the formation of the line trench and via openings in the dual damascene process sequence and in the removal of photoresists used in patterning the very low k materials as described above, it is very difficult, if not impossible, to avoid plasma damage of the very low k material during a dual damascene process sequence known in the art.

While several attempts have been made to minimize the loss of hydrophobicity in the low k films using non-oxidizing resist strip plasmas consisting of some or all of He, $H_2$, $N_2$, CO etc., none of these plasma chemistries known in the art succeed in completely preventing the loss of hydrophobicity of the very low k materials. This is especially the case for porous low k materials which have a very large surface area, and consequently are susceptible to damage during the resist strip processes. Further, use of less damaging strip processes often limits the efficacy with which photoresist and a disposable via fill plug are removed. Reduction in the efficacy of the photoresist and the disposable via fill plug may in turn result in unwanted organic residues in the metal interconnect structure, which are detrimental to effecting good metal fills and metal to metal contacts in a multilevel metal interconnect structure. Thus the use of such mild stripping plasma processes tends to limit the overall process window of the DD process and yield.

Another method of circumventing the problem of plasma damage caused by a plasma strip process is use of fluorinated or non-fluorinated organic polymer based low k materials such as Dow Chemical's SiLK™ dielectric, Honeywell's Flare™, polyimides, benzocyclobutene, polybenzoxazoles, aromatic thermoset polymers based on polyphenylene ethers; chemical vapor deposited polymers such as poly(p-xylylene) which are not susceptible to damage during conventional plasma strip processes. However, these materials do not possess the other properties required of a low k dielectric material such as a low thermal expansion, high hardness, and small pore sizes provided by porous organosilicate materials. Hence, use of the fluorinated or non-fluorinated organic polymer based low k materials causes reliability concerns.

Methods of partially repairing and restoring properties of the plasma damaged organosilicate IMD layer up to some degree are known in the prior art. The most common of these methods is known as a silylation process, wherein the plasma damaged organosilicate IMD layer is exposed to suitable reaction agents known as silylation agents with a structural formula $X_n$—Si—$R_m$, where m+n=4, which react with the silanols in the plasma damaged organosilicate IMD layer. The reaction removes hydrogen from the —OH groups in the silanols forming a volatile product that can be removed, while leaving a Si—O—Si—R moiety in the plasma damaged organosilicate IMD layer. The resulting structure is hydrophobic due to the organic group R, and if the replacement is complete, that is, if all silanol groups are reacted with the agent, the dielectric properties of the plasma damaged organosilicate IMD layer can be partially restored. Examples of silylation agents include but not limited to mono-, di- or trichloro silane, mono-, di- or tri-ethoxy or methoxy silane, bis(dimethyl amino)dimethyl silane and the like. U.S. Pat. No. 7,179, 758 to Chakrapani et al. discloses several preferred silylation agents and silylation reaction methodologies, and is herein incorporated by reference.

One limitation of these repair methods is the degree to which the damage can be remediated. The effectiveness of the repair could be affected by the relative size and reactivity of the silylation agent molecules and pore diameters in the ultra low k IMD layer as well as possible steric hindrance generated when one of the Si—OH sites has reacted with the agent molecule, thus restricting access for further reaction with a neighboring silanol site. As porosity levels are increased to lower the dielectric constant of the ultra low k IMD layer, the level of plasma damage tends to increase, and concomitantly as pore sizes are reduced to improve the properties of the ultra low k IMD layer, the ability to repair the damage after it has already been generated becomes more difficult.

In view of the above, there exists a need for a method for minimizing or preventing the plasma damage inflicted upon the ultra low k IMD layer during formation of a dual damascene metal interconnect structure, while retaining the capability to employ a plasma strip process required to enable full removal of photoresist and a disposable via fill plug used in the dual damascene process sequence.

Further, there exists a need for a method of forming a dual damascene metal interconnect structure in which the line width of a metal line is not significantly increased from the line width of a lithographic pattern used to define the same.

In addition, there exists a need for a method of forming a dual damascene metal interconnect structure in which a more manufacturable lithographic process window may be employed for forming fine metal lines required in high density BEOL metal interconnect structures.

SUMMARY OF THE INVENTION

The present invention addresses the needs described above by minimizing plasma damage to low k and ultra low k organosilicate intermetal dielectric layers. The reduction of the plasma damage is effected by interrupting the etch and strip process flow at a suitable point to add an inventive protective spacer. Optional densification treatment may be performed to protect an intermetal dielectric layer from plasma damage during a subsequent plasma strip process. Reduction of plasma damage in this manner also enables reduction of increase in the line width of a metal trench during a post strip wet clean which is performed for improving electrical yields of a metal interconnect structure formed therefrom.

A feature of the present invention is the introduction of inventive processing steps after the reactive ion etch patterning of a line trench and via cavity and prior to a plasma strip process for removal of a disposable via fill material in a dual damascene process sequence. Different inventive processing steps are provided in various embodiments of the present invention.

In a first embodiment, a protective layer is formed on all the exposed surfaces of a patterned intermetal dielectric (IMD) layer by a plasma based deposition process. Horizontal portions of the protective layer are removed by a directional etch that forms protective spacers on the sidewalls of the line trench and the sidewalls of the via cavity. The protective spacers protect the patterned IMD layer during a plasma strip process employed for removal of a disposable via fill plug, thus preventing or reducing plasma damage the sidewalls of the line trench of the patterned IMD layer.

In a second embodiment, a densification treatment is performed after formation of the protective spacers according to the first embodiment. The densification treatment may be a low energy ion bombardment with inert gas species such as helium, neon, argon, krypton or xenon; gas cluster ion beam treatment; a thermal cure at an elevated temperature from about 200° C. to about 400° C. for a time period from about 1 minute to about 30 minutes; an ultraviolet irradiation assisted thermal cure at an elevated temperature from about 200° C. to about 400° C. for a time period from about 1 minute to about 30 minutes; or a combination thereof. The densification treatment densifies exposed horizontal surfaces of the patterned IMD layer that are not protected by the protective spacers to form a densified trench bottom region, thus affording some improvement in their resistance to plasma damage by reactive plasmas during a plasma strip process employed for removal of a disposable via fill plug. Additionally, the densified trench bottom region provides an improved resistance to a wet etch solution employed during removal of residual material by a wet clean.

After these inventive treatments, the dual damascene process is continued through the steps of plasma strip of the residual planarization/via fill layer, post strip wet cleans, metal fill and chemical mechanical planarization as described in the prior art to form the DD interconnect wires and vias.

Formation of the protective spacer and the optional densified trench bottom region may be effected either by removing a substrate from the etch and strip plasma tools to ambient air, loading the substrate into a separate processing tool, and performing the additional step in that tool; or by transferring the substrate in vacuum through a suitable load lock arrangement to another process chamber in the same tool cluster; or performed in the very same tool or process chamber where the etch and the plasma strip processes are carried out simply by changing the process gas ambient and temperature conditions. After the plasma strip process is completed, any residual portion of the protective spacer and the optional densified trench bottom region may be retained in the in the metal interconnect structure or removed by a wet clean that is typically employed in the dual damascene process sequence.

According to an aspect of the present invention, a semiconductor structure is provided, which comprises:

an intermetal dielectric layer including a dielectric material having a dielectric constant less than 3.0 and located on a substrate;

a metal line and a metal via of integral construction located within the intermetal dielectric layer, wherein the metal line has a substantially horizontal bottom surface adjoining the metal via; and a densified trench bottom region comprising the dielectric material at a higher density than the intermetal dielectric layer and vertically abutting the substantially horizontal bottom surface of the metal line.

In one embodiment, the intermetal dielectric layer comprises an organosilicate dielectric material.

In another embodiment, the semiconductor structure further comprises:

at least one semiconductor device located on the substrate; and at least one interconnect wiring on the substrate.

In even another embodiment, the semiconductor structure further comprises a diffusion barrier dielectric layer located underneath and vertically abutting the intermetal dielectric layer.

In yet another embodiment, the semiconductor structure further comprises another intermetal dielectric layer including another dielectric material having a dielectric constant less than 3.0 and vertically abutting said diffusion barrier dielectric layer and a metal via located within said another intermetal dielectric layer and said diffusion barrier dielectric layer.

In still another embodiment, the semiconductor structure further comprises another metal line vertically abutting the metal via.

According to another aspect of the present invention, a method for fabricating an interconnect structure is provided, which comprises:

forming an intermetal dielectric layer on a substrate;

forming a via hole in the intermetal dielectric layer and filling a lower portion of the via hole with a disposable via fill material;

forming a line trench in the intermetal dielectric layer over the via hole;

forming a protective spacer on sidewalls of the line trench and on sidewalls of an upper portion of the via hole, wherein the protective spacer contains one of silicon dioxide, an organosilicate material with penant alkyl, aryl or allyl groups, and organosilicate materials having linked carbo-silane bonds, and wherein a portion of a bottom surface of the line trench is not covered by the protective spacer;

performing a densification treatment on the bottom surface of the line trench to form a densified trench bottom region; and performing a plasma strip to remove the disposable via fill material, while the protective layer and the densified trench bottom region protect the intermetal dielectric layer from damage during the plasma strip.

In one embodiment, the method further comprises:

forming a diffusion barrier dielectric layer on the substrate prior to the forming of the intermetal dielectric layer;

etching a contact hole through the diffusion barrier dielectric layer after performing the plasma strip; and filling the contact hole, the via hole, and the line trench with a conductive barrier metal liner and a conductive via fill material.

In another embodiment, the diffusion barrier dielectric layer comprises at least one of silicon nitride, silicon carbide, and silicon-carbonitride material that is deposited by plasma enhanced chemical vapor deposition or spin on coating.

In even another embodiment, the method further comprises:

forming a hard mask on the intermetal dielectric layer;

forming an interconnect line trench in the intermetal dielectric layer over the via hole; and planarizing the conductive barrier metal liner and the conductive via fill material.

In yet another embodiment, the hard mask layer comprises at least one material selected from silicon oxide, silicon nitride, and silicon-oxycarbide.

In still another embodiment, the method further comprises:

applying a first photolithographic resist on the hard mask and patterning the first photolithographic resist in the form of interconnect vias;

transferring a pattern in the first photolithographic resist into the hard mask and the intermetal dielectric layers by a reactive ion etch to form the via hole;

removing the first photolithographic resist;

applying a disposable via fill material to fill the via hole, wherein a top surface of the disposable via fill material is substantially planar;

depositing a pattern transfer mask layer on the disposable via fill material;

applying a second photolithographic resist on the pattern transfer mask layer and patterning the first photolithographic resist in the form of interconnect lines; and transferring another pattern in the second photolithographic resist into the pattern transfer mask, the disposable via fill material, the hard mask layer and into the intermetal dielectric by reactive ion etching, while concurrently consuming a portion of the disposable via fill material.

In still yet another embodiment, the pattern transfer mask layer comprises at least one material selected from silicon oxide, organosilicate glass, and siloxane.

In a further embodiment, the pattern transfer mask layer is deposited on the disposable via fill material by at least one method selected from plasma enhanced chemical vapor deposition, chemical vapor deposition, and spin coat and cure, at a temperature that does not affect the composition or physical integrity of the disposable via fill material.

In an even further embodiment, the protective layer comprises at least one material selected from silicon oxide, an organosilcate material, an organosilcate material with carbosilane functional groups containing bridged silicon-carbon-silicon bonds in chemical composition, and an organosilicate material with pendant groups selected from alkyl, allyl, and aryl moieties in chemical composition, and wherein the protective layer is deposited by at least one process selected from chemical vapor deposition, plasma enhanced chemical vapor deposition, and spin coating curing employing precursors containing silane, siloxane, carbosilanes, organosiloxanes, oxygen, nitrous oxide, or mixtures thereof.

In a yet further embodiment, the intermetal dielectric layer comprises a porous organosilicate dielectric material, wherein the porous organosilicate dielectric material includes silicon, carbon, oxygen and hydrogen.

In a still further embodiment, the intermetal dielectric layer is formed by chemical vapor deposition (CVD), plasma enhanced CVD or spin on coating and curing, wherein the curing is performed at an elevated temperature from about 250° C. to about 450° C. in a controlled gas ambient with or without an ultraviolet or electron beam irradiation.

In a still yet further embodiment, the controlled gas ambient is a non-oxidizing ambient comprising an inert gas, hydrogen, or a mixture thereof, wherein the non-oxidizing ambient is free of oxygen and moisture, and the inert gas contains at least one of helium, argon, and nitrogen.

In further another embodiment, the substrate comprises a semiconductor material.

In even further another embodiment, the disposable via fill material is a spin coatable organic material having a molecular weight less than 100,000 and more preferably less than 30,000 and having a lower reactive ion etch rate than etch rates of the intermetal dielectric and the hard mask layer.

In yet further another embodiment, the plasma strip comprises at least one of reactive ion etching, plasma etching, and down stream ashing, and employs active plasma species including an oxidizing gas, a reducing gas, an admixture of the oxidizing gas and the inert gas, or an admixture of the reducing gas with the inert gas, wherein the oxidizing gas includes at least one of oxygen, water vapor, and carbon dioxide, the reducing gas includes at least one of ammonia and hydrogen, and the inert gas includes at least one of nitrogen, argon, and helium.

According to yet another aspect of the present invention, another method for fabricating an interconnect structure is provided, which comprises:

forming an intermetal dielectric layer on a substrate;

forming a via hole in the intermetal dielectric layer and filling a lower portion of the via hole with a disposable via fill material;

forming a protective spacer on sidewalls of the interconnect line trench and on sidewalls of an upper portion of the via hole, wherein the protective spacer contains one of silicon oxide, an organosilicate material, an organosilicate material with pendant alkyl, aryl or allyl groups, and an organosilicate material having linked carbo-silane bonds on the intermetal dielectric layer, and wherein at least a portion of a bottom surface of the interconnect line trench is not covered by the protective spacer;

performing a densification treatment on the bottom surface of the line trenches to form a densified trench bottom region; and performing a plasma strip to remove the disposable via fill material, while the protective layer and the densified trench bottom region protects the intermetal dielectric layer from damage during the plasma strip.

In one embodiment, the densification treatment comprises at least one of bombardment by an inert gas plasma, bombardment by a gas cluster ion beam, thermal annealing, thermal annealing with simultaneous ultraviolet irradiation.

In another embodiment, the inert gas plasma or the gas cluster ion beam is formed from a gas containing at least one of helium, neon, argon, krypton, and xenon.

In yet another embodiment, the thermal annealing or the thermal annealing with simultaneous ultraviolet irradiation is performed at a temperature between 200° C. and 400° C. and for a time period from about 1 minute to about 30 minutes.

In still another embodiment, the method further comprises performing a wet clean wherein said densified trench bottom region and said protective spacer protect said intermetal dielectric layer during said wet clean.

BRIEF DESCRIPTION OF THE DRAWINGS

FIGS. 1A-1I are sequential vertical cross-sectional views of an exemplary prior art metal interconnect structure employing an exemplary prior art via first integration scheme including a dual damascene process sequence.

FIGS. 2A-2F are sequential vertical cross-sectional view of a first exemplary metal interconnect structure in which plasma damage reduction is effected by formation of an inventive protective spacer according to a first embodiment of the present invention.

FIGS. 3A-3E are sequential vertical cross-sectional view of a second exemplary metal interconnect structure in which plasma damage reduction is effected by formation of an inventive protective spacer and a densified trench bottom region in an ultra low k intermetal layer according to a second embodiment of the present invention.

DETAILED DESCRIPTION OF THE INVENTION

Figures 1A, 1B, 1C:
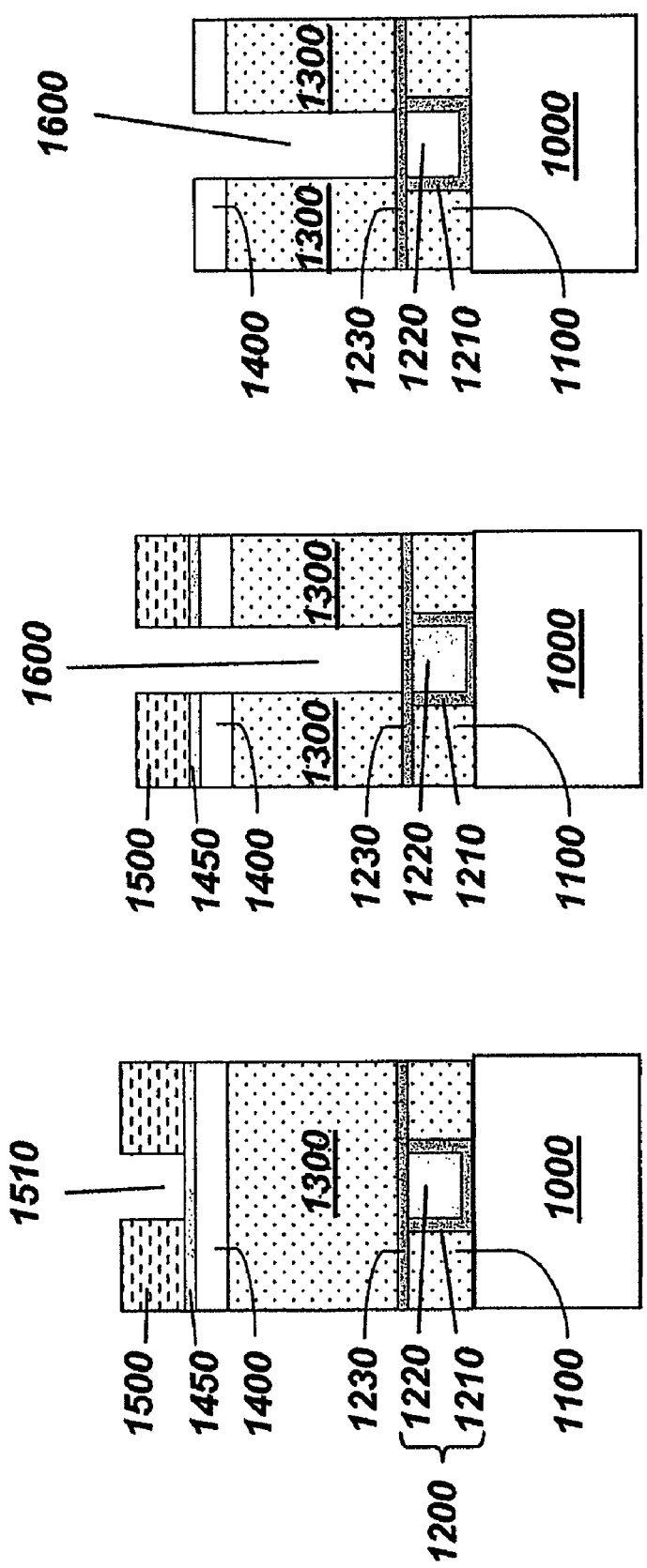

As stated above, the present invention relates to methods of manufacturing an interconnect structure that reduces signal propagation delay in a semiconductor circuit by minimizing plasma damage to low k and ultra low k organosilicate intermetal dielectric layers with a protective sidewall spacer, which are now described in detail with accompanying figures. It is noted that like and corresponding elements described herein and illustrated in the drawings are referred to by like reference numerals.

Embodiment 1

Use of a Protective Spacer

In embodiment 1, or the first embodiment, of the present invention, the integration sequence including the dual damascene etch and the plasma strip process described in FIGS. 1A-1I and accompanying paragraphs is interrupted after the patterning of the line trench 2800 in the second intermetal dielectric (IMD) layer 1300 and prior to removal of the patterned disposable material layer 2110 and the disposable via fill plug 2710. In other words, the prior art dual damascene process sequence described in FIGS. 1A-1F and accompanying paragraphs above are employed. For the sake of clarity, the prior art metal interconnect structure of FIG. 1F is reproduced as FIG. 2A with the same reference numerals. Thus, the first exemplary metal interconnect structure according to the first embodiment of the present invention shown in FIG. 2A is substantially the same as the prior art structure of FIG. 1F, and may be derived by the same processing steps known in the art.

Optionally, a short and mild plasma strip process or a mild wet clean that does not substantially alter the first exemplary metal interconnect structure may be performed at this point to remove any surface polymer that may be present on the sidewalls and horizontal surfaces of the second IMD layer 1300. Process parameters of such a treatment are chosen in strength and duration to be mild, and are not intended for any substantial removal of the disposable via fill plug 2710.

Referring to FIG. 2B, a protective layer 2900 is deposited on the sidewalls and a bottom surface of the second IMD layer 1300, sidewalls and a top surface of the hard mask layer 1400, sidewalls of the via hole beneath the line trench 2800, and a top surface of the disposable via fill plug 2710. In one embodiment, the protective layer 2900 may comprise silicon oxide, which may be deposited by at least one process selected from chemical vapor deposition, plasma enhanced chemical vapor deposition, using precursors such as silane, alkyl silanes, along with oxygen or nitrous oxide; and by spin coating curing employing precursors containing siloxane, oragnosloxanes or mixtures thereof.

In another embodiment, the protective layer 2900 comprises an organo-silicate material having linked carbo-silane bonds that are deposited by at least one process selected from chemical vapor deposition, plasma enhanced chemical vapor deposition, and spin coating curing employing precursors containing silane, siloxane, carbosilanes, organosiloxanes, or mixtures thereof.

The deposition of protective layer 2900 may be performed in a stand alone tool into which the first exemplary metal interconnect structure on the substrate 1000 is introduced and processed. Alternately the selective deposition may be performed in a chamber that is part of a clustered tool configuration that contains a reactive ion etch (RIE) chamber and a plasma strip chamber, from and to which the first exemplary metal interconnect structure on the substrate 1000 may be transferred through a suitable vacuum load lock arrangement.

Preferably, the protective layer 2900 is resistant to a plasma strip process to be subsequently employed to remove the disposable via fill plug 2710. Optionally, the protective layer 2900 may be modified after the plasma strip process in a manner that allows easy removal of the remaining portions of the protective layer 2900 by a subsequent wet clean. The second IMD layer 1300 is not directly exposed to the plasma of the plasma strip process that is employed to remove the disposable via fill plug 2710 and the patterned disposable material layer 2110.

Referring to FIG. 2C, a directional etch such as a reactive ion etch (RIE) is performed on the first exemplary metal interconnect structure. The directional etch removes the horizontal portions of the protective layer 2900 that are located on a top surface of the patterned disposable material layer 2110, on horizontal surfaces of the line trench 2800, and on the disposable via fill plug 2710. Protective spacers 3900 are formed from the remaining portions of the protective layer

2900. Specifically, one of the protective spacers 3900 is formed on sidewalls of the line trench 2900, and another of the protective spacers 3900 is formed on sidewalls of the via hole located between the line trench 2800 and the disposable via fill plug 2710. The two protective spacers 3900 are disjoined from each other.

Referring to FIG. 2D, once the protective spacers 3900 are formed, the first exemplary metal interconnect structure on the substrate 1000 is transferred to a plasma strip chamber to effect removal of the patterned disposable material layer 2110 and the disposable via fill plug 2710. After removal of the disposable via fill plug 2710, a via cavity 2960 that vertically extends from the bottom surface of the line trench 2800 to a top surface of the diffusion barrier dielectric layer 1230 is formed. A suitably aggressive strip process may be employed for this removal process since the second IMD layer 1300 and the hard mask layer 1400 are laterally protected by the protective spacers 3900. The protective spacers 3900 may be partially removed or modified in chemical composition. Little or no plasma damage is imparted to sidewalls of the second IMD layer 1300 or the hard mask layer 1400 during the plasma strip process.

Referring to FIG. 2E, another reactive ion etch (RIE) is performed to selectively open a contact hole in the diffusion barrier dielectric layer 1230. The via cavity 2960 extends from the bottom surface of the line trench 2800 to a top surface of the first level damascene metal line 1200. Not necessarily but preferably, a wet clean is subsequently performed in a suitable medium such as dilute hydrofluoric (DHF) acid solution to remove any residual material from the plasma strip process. The protective spacers 3900 may be removed simultaneously with the removal of the residual material. A dual damascene cavity comprising the line cavity 2800 and the via cavity 2960 is formed.

One aspect of this approach is that the bottom surface of the line trench 2800 is not protected during the plasma strip process and may incur some plasma damage. However, the sidewalls of the line trench and the sidewalls of the via hole are protected from damaging effects of plasma during the plasma strip process.

Figures 1G, 1H, 1I:
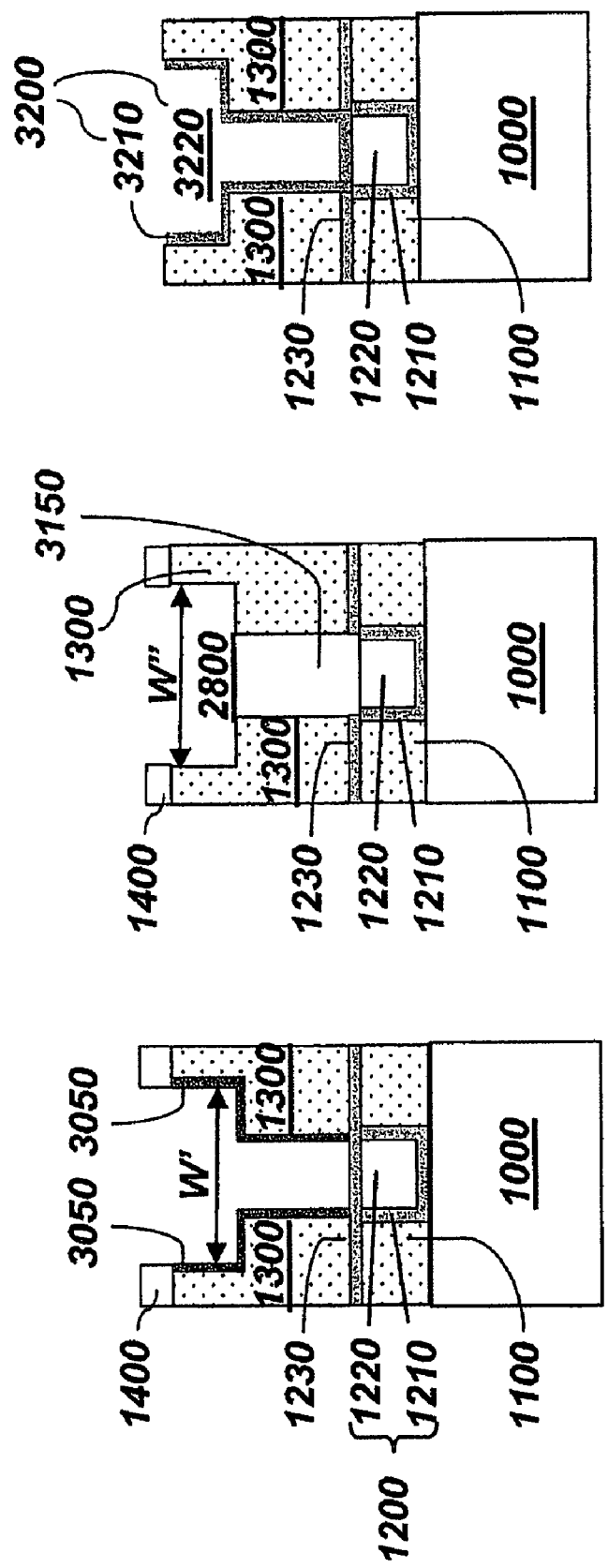

In comparison with the exemplary prior art metal interconnect structure of FIG. 1H, the line width W in FIG. 2E is smaller than the second width W'' in FIG. 1H for a given lithographic dimension for the line trench pattern 2500 of FIG. 1D. Instead, the line width W is substantially the same as the first width W' in FIG. 1G. The difference between the line width W in FIG. 2D and the second width W'' in FIG. 1H is due to the formation of the plasma damaged IMD region 3050 in the processing steps corresponding to FIG. 1G and subsequent removal of the plasma damaged IMD region 3050 by a wet clean. Since the thickness of the plasma damaged IMD region 3050 is substantial, the difference between the second width W'' and the first width W' is also substantial.

In the prior art, the lateral thickness of the plasma damaged IMD region 3050, and hence the difference between the second width W'' and the first width W' increases as the porosity of the second IMD layer 1300 increases to enable low k values. Use of a long and aggressive plasma strip process, which is required to ensure complete removal of the disposable via fill material from the patterned disposable material layer 2110 and disposable via fill plug 2710, increases the extent of damage to the second IMD layer 1300, and consequently, the lateral thickness of the plasma damaged region 3050 and the lateral enlargement of the line trench 2800 by the difference between the second width W'' and the first width W' of the exemplary prior art metal interconnect structure. Lithographic processes are currently forced to provide smaller feature sizes to account for this anticipated lateral enlargement of the line trench 2800, which renders the lithographic processes expensive and less manufacturable. As discussed above, less aggressive plasma strip processes are being explored, but currently does not ensure a complete removal of the disposable via fill material from the patterned disposable material layer 2110 and disposable via fill plug 2710.

In contrast, the use of the protective spacers 3900 of the first embodiment of the present invention laterally protects the second IMD layer 1300 from plasma damage during the plasma strip process, and hence avoids such a lateral enlargement of the line trench 2800. As a result, more relaxed lithographic processes and more aggressive plasma strip processes may be employed, which allow lower cost, improved manufacturability and higher yield compared to the manufacturing processes known in the art.

Referring to FIG. 2F, metallization, plating, and planarization is performed to form a dual damascene metal interconnect structure 3200 which comprises a second conductive diffusion barrier/adhesion layer 3210 and second level integrated metal line and via 3220 which typically comprise copper. The inventive processing steps may be repeated to construct a multi-level dual damascene metal interconnect structure (not shown).

One limitation of the first embodiment is that the bottom surface of the line trench 2800 is not protected during the plasma strip process, and may incur some plasma damage. A second embodiment of the present invention described below address this limitation of the first embodiment.

Embodiment 2

Use of a Protective Spacer and Densification of a Trench Bottom Region

In embodiment 2, or the second embodiment, of the present invention, the integration sequence of the first embodiment is employed up to the step corresponding to fabrication of the metal interconnect structure shown in FIG. 2C. For the sake of clarity, the metal interconnect structure of FIG. 2C is reproduced as FIG. 3A with the same reference numerals. Thus, the second exemplary metal interconnect structure according to the second embodiment of the present invention shown in FIG. 3A is substantially the same as the first exemplary metal interconnect structure of FIG. 2C, and may be derived by the same processing steps disclosed above.

Referring to FIG. 3B, a near surface region of the second IMD layer 1300 located near the bottom surface of the line trench 2800 is subjected to a densification process that renders the near surface region more robust against damaging effects of plasma in a subsequent plasma strip process and etching during a subsequent wet clean in a dilute hydrofluoric acid (HF) solution. The surface region thus densified is herein referred to as a densified trench bottom region 3920. The densified trench bottom region 3920 comprises the material of the second IMD layer 1300 at a higher density. Generally, sensitivity to the densification process strongly increases with an increase in the porosity and decrease in the density of the material of the second IMD layer 1300.

According to a first method of the second embodiment, the densification process employs exposure of the bottom surface of the line trench 2800 to a low energy directional bombardment using an inert gas plasma known in the art. An inert gas such as He, Ne, Ar, Xe, Kr, or some other species which does react deleteriously with the dielectric material may be used. Not necessarily but preferably, the plasma is excited by multiple radio frequency (RF) or microwave sources so as to allow independent control of plasma density and the energy of ions arriving at the bottom surface of the line trench 2800. Preferably, a high flux of inert gas ions arrives at the surface with low energy, so that the energy of the inert gas ions is transferred to the exposed surface of the second IMD layer 1300 for densification of the material only in the densified trench bottom region 3920, while the remaining portion of the second IMD layer 1300 remains unaffected. The pressure of the neutral gases is between 1 mTorr to 100 mTorr to achieve a desirable flux and the energy of the inert gas ions is preferably from about 1 eV to about 100 eV, and more preferably from about 3 eV to about 30 eV. Furthermore, ultraviolet light emitted from the plasma facilitates crosslinking reactions in the densified trench bottom region 3920. The surface treatment may be accomplished in the same RIE and/or strip process chamber, or may employ a different process chamber. The thickness of the densified trench bottom region 3920 may be tuned to a relatively small thickness, which may be from about 1 mm to about 20 nm.

According to a second method of the second embodiment, the densification process employs exposure of the bottom surface of the line trench 2800 to a Gas Cluster Ion Beam (GCIB). The exposure to the GCIB may be performed in a dedicated process chamber specially designed for this purpose. The generation of the GCIB employs formation of condensed clusters containing many atoms via evaporation followed by an adiabatic pressure decrease. Once the clusters are formed, they are ionized by exposure to an electron beam or plasma. The charged clusters are then attracted to the surfaces of the second exemplary metal interconnect structure by application of an electrical potential on the substrate 1000. Because an ionized cluster has a high mass to charge ratio, the ionized cluster carries a significantly greater momentum for a given energy than ions or radicals made up of a single or a few atoms and having a lower per unit mass that may be generated in a conventional plasma. The greater momentum of the ionized cluster, in turn, facilitates the deposition of the ionized cluster's energy in a region near the exposed surfaces. Particularly, the surface region at the bottom of the line trench 2800 is bombarded with the ionized clusters, and consequently forms the densified trench bottom region 3920. This is advantageous for achieving the desired densification only in the densified trench bottom region 3920 without compromising the bulk properties of the remaining portion of the second IMD layer 1300. The same inert gases may be employed for the exposure to the GCIB as for the directional bombardment using an inert gas plasma. The thickness of the densified trench bottom region 3920 may be tuned to a relatively small thickness, which may be from about 1 nm to about 20 nm.

Methods of using the GCIB for densifying a porous dielectric material is disclosed in U.S. Pat. No. 7,071,126 to Johnston and O'Brien, which is incorporated herein by reference. The exposure to the GPIB is performed after the formation of the protective spacer 3900 and prior to the plasma strip process to form the densified trench bottom region 3920 underneath a patterned surface, which is the bottom surface of the line trench 2800 formed within the second IMD layer 1300 so that densified trench bottom region 3920 protects the underlying second IMD layer 1300 during a subsequent plasma strip process.

According to a third method of the second embodiment, the densification process employs exposing the second exemplary interconnect structure to a thermal anneal at an elevated temperature between 200° C. and 400° C. The densification process may be achieved more efficaciously by performing the thermal anneal with a simultaneous irradiation of the second exemplary metal interconnect structure with ultraviolet radiation. The thermal anneal and the optional simultaneous irradiation promotes silanol condensation and film crosslinking, which in turn leads to densification of a surface region directly underneath the bottom surface of the line trench 2800 to form a densified trench bottom region 3920. The densified trench bottom region 3920 is less prone to damage by a wet clean by a dilute hydrofluoric acid (HF) solution. This third method may allow formation of a thicker densified trench bottom region 3920 compared to the first or second method of the second embodiment. Further, the densified trench bottom region 3920 according to the third method may have a higher dielectric constant than a corresponding densified trench bottom region 3920 according to the first or second embodiment for a given material of the second IMD layer 1300, and may be mechanically more robust as a consequence.

According to a fourth method of the second embodiment, the densification process concurrently employs the third method and at least one of the first and second methods of the present invention in combination to further enhance the associated benefits. The fourth method may incur additional costs but also induces a higher density for the densified trench bottom region 3920, and hence an enhanced robustness and resistance to plasma damage during a subsequent plasma strip process and a subsequent wet clean compared to the use of only one of the components of the fourth method.

In the third and fourth methods of the second embodiment, some or all of the disposable via fill material in the disposable via fill plug 2710 may also be advantageously decomposed and removed by the thermal/UV exposure, which enables a reduction in the severity or duration of exposure to plasma during the plasma strip process.

Referring to FIG. 3C, the second exemplary metal interconnect structure is then subjected to a plasma strip process to remove the disposable via fill material from the patterned disposable material layer 2110 and the disposable via fill plug 2710. The protective spacers 3900 and the densified trench bottom region 3920 protect the second IMD layer 1300 during the plasma strip process.

Referring to FIG. 3D, the second exemplary metal interconnect structure is then subjected to a selective RIE process to open a contact hole in the diffusion barrier dielectric layer 1230. The densified trench bottom region 3920 also protects the second IMD layer 1300 during the selective RIE process.

Thereafter, a wet clean may be performed to remove residual material from the previous plasma processes which can optionally remove all or part of the protective spacers 3900. Since the protective spacers 3900 and the densified trench bottom region 3920 protect the second IMD layer 1300 throughout the plasma strip process, plasma damage on the second. IMD layer 1300 is avoided. As such, the wet clean does not cause a change in the line width W of the line trench 2800 in contrast to the change of the line width the exemplary prior art metal interconnect structure as exemplified by the difference between the second width W" in FIG. 1H and the first width W' in FIG. 1G. The portion of the second IMD layer 1300 directly underneath the densified trench bottom region 3920 is protected by the densified trench bottom region 3920 during the wet clean.

In a variation of the second embodiment, instead of forming the densified trench bottom region 3920 prior to the plasma strip process, the formation of the densified trench bottom region 3920 may be performed after the plasma strip process and prior to the wet clean. In this case, protection of the second IMD layer 1300 by a densified trench bottom region 3920 is afforded only during the wet clean.

In another variation of the second embodiment, both the protective spacers 3900 and the densified trench bottom region 3920 are fully removed. In a yet another variation of the second embodiment, at least a portion of the protective spacers 3900 and the densified trench bottom region 3920 are retained to provide protection of the second IMD layer 1300 after the wet clean and up to subsequent metallization and plating.

Referring to FIG. 3E, metallization, plating, and planarization is performed to form a dual damascene metal interconnect structure 3200 which comprises a second conductive diffusion barrier/adhesion layer 3210 and second level integrated metal line and via 3220 which typically comprise copper. The inventive processing steps may be repeated to construct a multi-level dual damascene metal interconnect structure (not shown).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for fabricating an interconnect structure comprising:
   forming an intermetal dielectric layer on a substrate;
   forming a via hole in said intermetal dielectric layer and filling a lower portion of said via hole with a disposable via fill material;
   forming an interconnect line trench in said intermetal dielectric layer over said via hole;
   forming a protective spacer on sidewalls of said interconnect line trench and on sidewalls of an upper portion of said via hole, wherein said protective spacer contains one of silicon dioxide, an organosilicate material with penant alkyl, aryl or allyl groups, and organosilicate materials having linked carbo-silane bonds, and wherein at least a portion of a bottom surface of said interconnect line trench is not covered by said protective spacer; and
   performing a plasma strip to remove said disposable via fill material, while said protective spacer protects said intermetal dielectric layer covered by said protective spacer from damage during said plasma strip.

2. The method of claim 1, further comprising:
   forming a diffusion barrier dielectric layer on said substrate prior to said forming of said intermetal dielectric layer;
   etching a contact hole through said diffusion barrier dielectric layer after said performing of said plasma strip; and
   filling said contact hole, said via hole, and said interconnect line trench with a conductive barrier metal liner and a conductive via fill material.

3. The method of claim 2, wherein said diffusion barrier dielectric layer comprises at least one of silicon nitride, silicon carbide, and silicon-carbonitride material that is deposited by plasma enhanced chemical vapor deposition or spin on coating.

4. The method of claim 2, further comprising:
   forming a hard mask on said intermetal dielectric layer;
   forming the interconnect line trench in said intermetal dielectric layer over said via hole; and
   planarizing said conductive barrier metal liner and said conductive via fill material.

5. The method of claim 4, wherein said hard mask layer comprises at least one material selected from silicon oxide, silicon nitride, and silicon-oxycarbide.

6. The method of claim 4, further comprising:
   applying a first photolithographic resist on said hard mask and patterning said first photolithographic resist in the form of interconnect vias;
   transferring a pattern in said first photolithographic resist into said hard mask and said intermetal dielectric layer by a reactive ion etch to form said via hole;
   removing said first photolithographic resist;
   applying said disposable via fill material to fill said via hole, wherein a top surface of said disposable via fill material is substantially coplanar with a top surface of said hardmask;
   depositing a pattern transfer mask layer on said disposable via fill material;
   applying a second photolithographic resist on said pattern transfer mask layer and patterning said first photolithographic resist in the form of interconnect lines; and
   transferring another pattern in said second photolithographic resist into said pattern transfer mask, said disposable via fill material, said hard mask layer and into said intermetal dielectric by reactive ion etching, while concurrently consuming a portion of said disposable via fill material.

7. The method of claim 6, wherein said pattern transfer mask layer comprises at least one material selected from silicon oxide, organosilicate glass, and siloxane.

8. The method of claim 6, wherein said pattern transfer mask layer is deposited on said disposable via fill material by at least one method selected from plasma enhanced chemical vapor deposition, chemical vapor deposition, and spin coat and cure, at a temperature that does not affect composition or physical integrity of said disposable via fill material.

9. The method of claim 1, wherein said protective spacer comprises at least one material selected from silicon oxide, an organosilicate materials, an organosilcate material with carbosilane functional groups containing bridged silicon-carbon-silicon bonds in chemical composition, and an organosilicate material with pendant groups selected from alkyl, allyl and aryl moieties in chemical composition, and wherein said protective spacer is deposited by at least one process selected from chemical vapor deposition, plasma enhanced chemical vapor deposition, and spin coating curing employing precursors containing silane, siloxane, carbosilanes, organosiloxanes, oxygen, nitrous oxide or mixtures thereof.

10. The method of claim 1, wherein said intermetal dielectric layer comprises a porous organosilicate dielectric material, wherein said porous organosilicate dielectric material includes silicon, carbon, oxygen and hydrogen.

11. A method for fabricating an interconnect structure comprising:
    forming an intermetal dielectric layer on a substrate;
    forming a via hole in said intermetal dielectric layer and filling a lower portion of said via hole with a disposable via fill material;
    forming an interconnect line trench in said intermetal dielectric layer over said via hole;
    forming a protective spacer on sidewalls of said interconnect line trench and on sidewalls of an upper portion of said via hole, wherein said protective spacer contains one of silicon oxide, an organosilicate material, an organo-silicate material and having linked carbo-silane bonds, and an organosilicate material with pendant alkyl, aryl or allyl groups, on said intermetal dielectric layer, and wherein a portion of a bottom surface of said interconnect line trench is not covered by said protective spacer;

performing a densification treatment on said bottom surface of said interconnect line trench to form a densified trench bottom region; and performing a plasma strip to remove said disposable via fill material, while said protective spacer and said densified trench bottom region protect said intermetal dielectric layer from damage during said plasma strip.

12. The method of claim 11, wherein said densification treatment comprises at least one of bombardment by an inert gas plasma, bombardment by a gas cluster ion beam, thermal annealing, thermal annealing with simultaneous ultraviolet irradiation.

13. The method of claim 12, wherein said inert gas plasma or said gas cluster ion beam is formed from a gas containing at least one of helium, neon, argon, krypton, and xenon.

14. The method of claim 11, further comprising performing a wet clean wherein said densified trench bottom region and said protective spacer protect said intermetal dielectric layer during said wet clean.

* * * * *